US010319499B1

(12) United States Patent
Alfson et al.

(10) Patent No.: US 10,319,499 B1
(45) Date of Patent: Jun. 11, 2019

(54) SYSTEM AND METHOD FOR ADDITIVELY MANUFACTURING COMPOSITE WIRING HARNESS

(71) Applicant: CC3D LLC, Coeur d'Alene, ID (US)

(72) Inventors: Blake L. Alfson, Hayden Lake, ID (US); Kenneth Lyle Tyler, Coeur d'Alene, ID (US); Ryan C Stockett, Lebanon, NH (US); Tyler B. Alvarado, Coeur d'Alene, ID (US); Trevor David Budge, Coeur d'Alene, ID (US)

(73) Assignee: CC3D LLC, Coeur d'Alene, ID (US)

( * ) Notice: Subject to any disclaimer, the term of this patent is extended or adjusted under 35 U.S.C. 154(b) by 11 days.

(21) Appl. No.: 15/826,786

(22) Filed: Nov. 30, 2017

(51) Int. Cl.
    *H01B 7/17*     (2006.01)
    *H01B 7/00*     (2006.01)
    (Continued)

(52) U.S. Cl.
    CPC .............. *H01B 7/17* (2013.01); *B22F 3/008* (2013.01); *B29C 64/165* (2017.08); *B33Y 10/00* (2014.12); *B33Y 80/00* (2014.12); *B60R 16/0215* (2013.01); *H01B 7/0045* (2013.01); *H01B 13/0036* (2013.01); *H01B 13/01209* (2013.01); *H01B 13/22* (2013.01);
    (Continued)

(58) Field of Classification Search
    CPC ...... H01B 13/141; H01B 7/06; H01B 7/1815; H01B 7/182; H01B 7/17; H01B 7/183; H01B 7/225; H01B 7/186; H01B 17/12; H01B 7/0869; H01B 7/16; H01B 7/189; H01B 7/0266; H02G 3/0475; H02G 3/0481; H02G 3/487

USPC ..................... 174/72 C, 114 S, 119 R, 122 R
See application file for complete search history.

(56) References Cited

U.S. PATENT DOCUMENTS 2,544,233 A  *   3/1951   Kennedy ................ H01B 7/282
                                                              174/116
3,286,305 A      11/1966   Seckel
              (Continued)

FOREIGN PATENT DOCUMENTS

DE            4102257 A1     7/1992
EP             2589481 B1     1/2016
              (Continued)

OTHER PUBLICATIONS

A. Di. Pietro & Paul Compston, Resin Hardness and Interlaminar Shear Strength of a Glass-Fibre/Vinylester Composite Cured with High Intensity Ultraviolet (UV) Light, Journal of Materiais Science, vol. 44, pp. 4188-4190 (Apr. 2009).

(Continued)

*Primary Examiner* — Roshn K Varghese
(74) *Attorney, Agent, or Firm* — Ryan C. Stockett

(57) ABSTRACT

A method is disclosed for additively manufacturing a composite wiring harness. The method may include directing a plurality of conductors through a print head, directing at least one reinforcement through the print head, and coating at least one of the plurality of conductors and the at least one reinforcement with a matrix material. The method may also include discharging the at least one of the plurality of conductors and the at least one reinforcement with the matrix material from the print head, and exposing the matrix material during discharging to a cure energy to cause hardening of a sheath around the plurality of conductors.

9 Claims, 3 Drawing Sheets

(51) Int. Cl.
| | | |
|---|---|---|
| *H01B 13/00* | (2006.01) | |
| *H01B 13/22* | (2006.01) | |
| *B60R 16/02* | (2006.01) | |
| *H01B 13/012* | (2006.01) | |
| *B33Y 10/00* | (2015.01) | |
| *B33Y 80/00* | (2015.01) | |
| *B22F 3/00* | (2006.01) | |
| *B29C 64/165* | (2017.01) | |
| *H05K 9/00* | (2006.01) | |
| *B29L 31/34* | (2006.01) | |
| *B29K 105/06* | (2006.01) | |

(52) U.S. Cl.
CPC .. *B29K 2105/06* (2013.01); *B29K 2995/0005* (2013.01); *B29L 2031/3481* (2013.01); *H05K 9/00* (2013.01)

(56) References Cited

U.S. PATENT DOCUMENTS

| | | | |
|---|---|---|---|
| 3,809,514 A | 5/1974 | Nunez | |
| 3,984,271 A | 10/1976 | Gilbu | |
| 3,993,726 A | 11/1976 | Moyer | |
| 4,491,939 A * | 1/1985 | Carpenter | G01V 1/201 174/101.5 |
| 4,599,121 A * | 7/1986 | Edwards | H01B 7/285 156/48 |
| 4,643,940 A | 2/1987 | Shaw et al. | |
| 4,671,761 A | 6/1987 | Adrian et al. | |
| 4,791,246 A * | 12/1988 | Neuroth | H01B 7/0869 174/102 R |
| 4,822,548 A | 4/1989 | Hempel | |
| 4,851,065 A | 7/1989 | Curtz | |
| 5,002,712 A | 3/1991 | Goldmann et al. | |
| 5,037,691 A | 8/1991 | Medney et al. | |
| 5,296,335 A | 3/1994 | Thomas et al. | |
| 5,340,433 A | 8/1994 | Crump | |
| 5,746,967 A | 5/1998 | Hoy et al. | |
| 5,866,058 A | 2/1999 | Batchelder et al. | |
| 5,936,861 A | 8/1999 | Jang et al. | |
| 6,153,034 A | 11/2000 | Lipsker | |
| 6,444,915 B1 * | 9/2002 | Wang | H01B 7/06 174/110 R |
| 6,459,069 B1 | 10/2002 | Rabinovich | |
| 6,501,554 B1 | 12/2002 | Hackney et al. | |
| 6,566,604 B2 * | 5/2003 | Booth | G02B 6/4427 174/110 R |
| 6,799,081 B1 | 9/2004 | Hale et al. | |
| 6,803,003 B2 | 10/2004 | Rigali et al. | |
| 6,934,600 B2 | 8/2005 | Jang et al. | |
| 7,039,485 B2 | 5/2006 | Engelbart | |
| 7,507,908 B1 * | 3/2009 | Wu | H01B 7/06 174/110 R |
| 7,555,404 B2 | 6/2009 | Brennan et al. | |
| 7,588,216 B1 * | 9/2009 | Hoyl | H02G 3/30 174/50 |
| 7,643,713 B2 * | 1/2010 | Buthe | G02B 6/4416 385/101 |
| 7,692,099 B2 * | 4/2010 | Burke | H01B 7/06 174/113 C |
| 7,795,349 B2 | 9/2010 | Bredt et al. | |
| 8,221,669 B2 | 7/2012 | Batchelder et al. | |
| 8,962,717 B2 | 2/2015 | Roth et al. | |
| 9,098,126 B2 * | 8/2015 | Colley | H04M 1/6058 |
| 9,126,365 B1 | 9/2015 | Mark et al. | |
| 9,126,367 B1 | 9/2015 | Mark et al. | |
| 9,149,988 B2 | 10/2015 | Mark et al. | |
| 9,156,205 B2 | 10/2015 | Mark et al. | |
| 9,186,846 B1 | 11/2015 | Mark et al. | |
| 9,186,848 B2 | 11/2015 | Mark et al. | |
| 9,327,452 B2 | 5/2016 | Mark et al. | |
| 9,327,453 B2 | 5/2016 | Mark et al. | |
| 9,370,896 B2 | 6/2016 | Mark | |
| 9,381,702 B2 | 7/2016 | Hollander | |
| 9,457,521 B2 | 10/2016 | Johnston et al. | |
| 9,458,955 B2 | 10/2016 | Hammer et al. | |
| 9,527,248 B2 | 12/2016 | Hollander | |
| 9,539,762 B2 | 1/2017 | Durand et al. | |
| 9,579,851 B2 | 2/2017 | Mark et al. | |
| 9,688,028 B2 | 6/2017 | Mark et al. | |
| 9,694,544 B2 | 7/2017 | Mark et al. | |
| 9,764,378 B2 | 9/2017 | Peters et al. | |
| 9,770,876 B2 | 9/2017 | Farmer et al. | |
| 9,782,926 B2 | 10/2017 | Witzel et al. | |
| 9,805,842 B2 * | 10/2017 | Suguro | H02G 3/0462 |
| 2002/0009935 A1 | 1/2002 | Hsiao et al. | |
| 2002/0062909 A1 | 5/2002 | Jang et al. | |
| 2002/0113331 A1 | 8/2002 | Zhang et al. | |
| 2002/0165304 A1 | 11/2002 | Mulligan et al. | |
| 2003/0044539 A1 | 3/2003 | Oswald | |
| 2003/0056870 A1 | 3/2003 | Comb et al. | |
| 2003/0160970 A1 | 8/2003 | Basu et al. | |
| 2003/0186042 A1 | 10/2003 | Dunlap et al. | |
| 2003/0236588 A1 | 12/2003 | Jang et al. | |
| 2005/0006803 A1 | 1/2005 | Owens | |
| 2005/0061422 A1 | 3/2005 | Martin | |
| 2005/0104257 A1 | 5/2005 | Gu et al. | |
| 2005/0109451 A1 | 5/2005 | Hauber et al. | |
| 2005/0230029 A1 | 10/2005 | Vaidyanathan et al. | |
| 2007/0003650 A1 | 1/2007 | Schroeder | |
| 2007/0228592 A1 | 10/2007 | Dunn et al. | |
| 2008/0176092 A1 | 7/2008 | Owens | |
| 2009/0095410 A1 | 4/2009 | Oldani | |
| 2011/0032301 A1 | 2/2011 | Fienup et al. | |
| 2011/0036616 A1 * | 2/2011 | Catchpole | H01B 7/041 174/119 R |
| 2011/0143108 A1 | 6/2011 | Fruth et al. | |
| 2012/0060468 A1 | 3/2012 | Dushku et al. | |
| 2012/0159785 A1 | 6/2012 | Pyles et al. | |
| 2012/0231225 A1 | 9/2012 | Mikulak et al. | |
| 2012/0247655 A1 | 10/2012 | Erb et al. | |
| 2013/0164498 A1 | 6/2013 | Langone et al. | |
| 2013/0209600 A1 | 8/2013 | Tow | |
| 2013/0233471 A1 | 9/2013 | Kappesser et al. | |
| 2013/0292039 A1 | 11/2013 | Peters et al. | |
| 2013/0337256 A1 | 12/2013 | Farmer et al. | |
| 2013/0337265 A1 | 12/2013 | Farmer | |
| 2014/0034214 A1 | 2/2014 | Boyer et al. | |
| 2014/0061974 A1 | 3/2014 | Tyler | |
| 2014/0159284 A1 | 6/2014 | Leavitt | |
| 2014/0232035 A1 | 8/2014 | Bheda | |
| 2014/0268604 A1 | 9/2014 | Wicker et al. | |
| 2014/0291886 A1 | 10/2014 | Mark et al. | |
| 2015/0136455 A1 | 5/2015 | Fleming | |
| 2015/0188300 A1 * | 7/2015 | Adachi | B60R 16/0215 174/72 A |
| 2016/0012935 A1 | 1/2016 | Rothfuss | |
| 2016/0031155 A1 | 2/2016 | Tyler | |
| 2016/0046082 A1 | 2/2016 | Fuerstenberg | |
| 2016/0052208 A1 | 2/2016 | Debora et al. | |
| 2016/0082641 A1 | 3/2016 | Bogucki et al. | |
| 2016/0082659 A1 | 3/2016 | Hickman et al. | |
| 2016/0107379 A1 | 4/2016 | Mark et al. | |
| 2016/0114532 A1 | 4/2016 | Schirtzinger et al. | |
| 2016/0136885 A1 | 5/2016 | Nielsen-Cole et al. | |
| 2016/0144565 A1 | 5/2016 | Mark et al. | |
| 2016/0144566 A1 | 5/2016 | Mark et al. | |
| 2016/0192741 A1 | 7/2016 | Mark | |
| 2016/0200047 A1 | 7/2016 | Mark et al. | |
| 2016/0243762 A1 | 8/2016 | Fleming et al. | |
| 2016/0248238 A1 * | 8/2016 | Warren | H02G 3/0481 |
| 2016/0263806 A1 | 9/2016 | Gardiner | |
| 2016/0263822 A1 | 9/2016 | Boyd | |
| 2016/0263823 A1 | 9/2016 | Espiau et al. | |
| 2016/0271876 A1 | 9/2016 | Lower | |
| 2016/0297104 A1 | 10/2016 | Guillemette et al. | |
| 2016/0311165 A1 | 10/2016 | Mark et al. | |
| 2016/0325491 A1 | 11/2016 | Sweeney et al. | |
| 2016/0332369 A1 | 11/2016 | Shah et al. | |
| 2016/0339633 A1 | 11/2016 | Stolyarov et al. | |
| 2016/0346998 A1 | 12/2016 | Mark et al. | |
| 2016/0361869 A1 | 12/2016 | Mark et al. | |

(56) References Cited

U.S. PATENT DOCUMENTS

| | | |
|---|---|---|
| 2016/0368213 A1 | 12/2016 | Mark |
| 2016/0368255 A1 | 12/2016 | Witte et al. |
| 2017/0007359 A1 | 1/2017 | Kopelman et al. |
| 2017/0007360 A1 | 1/2017 | Kopelman et al. |
| 2017/0007361 A1 | 1/2017 | Boronkay et al. |
| 2017/0007362 A1 | 1/2017 | Chen et al. |
| 2017/0007363 A1 | 1/2017 | Boronkay |
| 2017/0007365 A1 | 1/2017 | Kopelman et al. |
| 2017/0007366 A1 | 1/2017 | Kopelman et al. |
| 2017/0007367 A1 | 1/2017 | Li et al. |
| 2017/0007368 A1 | 1/2017 | Boronkay |
| 2017/0007386 A1 | 1/2017 | Mason et al. |
| 2017/0008333 A1 | 1/2017 | Mason et al. |
| 2017/0015059 A1 | 1/2017 | Lewicki |
| 2017/0015060 A1 | 1/2017 | Lewicki et al. |
| 2017/0021565 A1 | 1/2017 | Deaville |
| 2017/0028434 A1 | 2/2017 | Evans et al. |
| 2017/0028588 A1 | 2/2017 | Evans et al. |
| 2017/0028617 A1 | 2/2017 | Evans et al. |
| 2017/0028619 A1 | 2/2017 | Evans et al. |
| 2017/0028620 A1 | 2/2017 | Evans et al. |
| 2017/0028621 A1 | 2/2017 | Evans et al. |
| 2017/0028623 A1 | 2/2017 | Evans et al. |
| 2017/0028624 A1 | 2/2017 | Evans et al. |
| 2017/0028625 A1 | 2/2017 | Evans et al. |
| 2017/0028627 A1 | 2/2017 | Evans et al. |
| 2017/0028628 A1 | 2/2017 | Evans et al. |
| 2017/0028633 A1 | 2/2017 | Evans et al. |
| 2017/0028634 A1 | 2/2017 | Evans et al. |
| 2017/0028635 A1 | 2/2017 | Evans et al. |
| 2017/0028636 A1 | 2/2017 | Evans et al. |
| 2017/0028637 A1 | 2/2017 | Evans et al. |
| 2017/0028638 A1 | 2/2017 | Evans et al. |
| 2017/0028639 A1 | 2/2017 | Evans et al. |
| 2017/0028644 A1 | 2/2017 | Evans et al. |
| 2017/0030207 A1 | 2/2017 | Kittleson |
| 2017/0036403 A1 | 2/2017 | Ruff et al. |
| 2017/0050340 A1 | 2/2017 | Hollander |
| 2017/0057164 A1 | 3/2017 | Hemphill et al. |
| 2017/0057165 A1 | 3/2017 | Waldrop et al. |
| 2017/0057167 A1 | 3/2017 | Tooren et al. |
| 2017/0057181 A1 | 3/2017 | Waldrop et al. |
| 2017/0064840 A1 | 3/2017 | Espalin et al. |
| 2017/0066187 A1 | 3/2017 | Mark et al. |
| 2017/0087768 A1 | 3/2017 | Bheda |
| 2017/0106565 A1 | 4/2017 | Braley et al. |
| 2017/0120519 A1 | 5/2017 | Mark |
| 2017/0129170 A1 | 5/2017 | Kim et al. |
| 2017/0129171 A1 | 5/2017 | Gardner et al. |
| 2017/0129176 A1 | 5/2017 | Waatti et al. |
| 2017/0129182 A1 | 5/2017 | Sauti et al. |
| 2017/0129186 A1 | 5/2017 | Sauti et al. |
| 2017/0144375 A1 | 5/2017 | Waldrop et al. |
| 2017/0151728 A1 | 6/2017 | Kunc et al. |
| 2017/0157828 A1 | 6/2017 | Mandel et al. |
| 2017/0157831 A1 | 6/2017 | Mandel et al. |
| 2017/0157844 A1 | 6/2017 | Mandel et al. |
| 2017/0157851 A1 | 6/2017 | Nardiello et al. |
| 2017/0165908 A1 | 6/2017 | Pattinson et al. |
| 2017/0173868 A1 | 6/2017 | Mark |
| 2017/0182712 A1 | 6/2017 | Scribner et al. |
| 2017/0210074 A1 | 7/2017 | Ueda et al. |
| 2017/0217088 A1 | 8/2017 | Boyd et al. |
| 2017/0232674 A1 | 8/2017 | Mark |
| 2017/0259502 A1 | 9/2017 | Chapiro et al. |
| 2017/0259507 A1 | 9/2017 | Hocker |
| 2017/0266876 A1 | 9/2017 | Hocker |
| 2017/0274585 A1 | 9/2017 | Armijo et al. |
| 2017/0284876 A1 | 10/2017 | Moorlag et al. |

FOREIGN PATENT DOCUMENTS

| | | |
|---|---|---|
| EP | 3219474 A1 | 9/2017 |
| KR | 100995983 B1 | 11/2010 |
| KR | 101172859 B1 | 8/2012 |
| WO | 2013017284 A2 | 2/2013 |
| WO | 2016088042 A1 | 6/2016 |
| WO | 2016088048 A1 | 6/2016 |
| WO | 2016110444 A1 | 7/2016 |
| WO | 2016159259 A1 | 10/2016 |
| WO | 2016196382 A1 | 12/2016 |
| WO | 2017006178 A1 | 1/2017 |
| WO | 2017006324 A1 | 1/2017 |
| WO | 2017051202 A1 | 3/2017 |
| WO | 2017081253 A1 | 5/2017 |
| WO | 2017085649 A1 | 5/2017 |
| WO | 2017087663 A1 | 5/2017 |
| WO | 2017108758 A1 | 6/2017 |
| WO | 2017122941 A1 | 7/2017 |
| WO | 2017122942 A1 | 7/2017 |
| WO | 2017122943 A1 | 7/2017 |
| WO | 2017123726 A1 | 7/2017 |
| WO | 2017124085 A1 | 7/2017 |
| WO | 2017126476 A1 | 7/2017 |
| WO | 2017126477 A1 | 7/2017 |
| WO | 2017137851 A2 | 8/2017 |
| WO | 2017142867 A1 | 8/2017 |
| WO | 2017150186 A1 | 9/2017 |

OTHER PUBLICATIONS

A. Endruweit, M. S. Johnson, & A. C. Long, Curing of Composite Components by Ultraviolet Radiation: A Review, Polymer Composites, pp. 119-128 (Apr. 2006).

C. Fragassa, & G. Minak, Standard Characterization for Mechanical Properties of Photopolymer Resins for Rapid Prototyping, 1st Symposium on Multidisciplinary Studies of Design in Mechanical Engineering, Bertinoro, Italy (Jun. 25-28, 2008).

Hyouk Ryeol Choi and Se-gon Roh, In-pipe Robot with Active Steering Capability for Moving Inside of Pipelines, Bioinspiration and Robotics: Walking and Climbing Robots, Sep. 2007, p. 544, I-Tech, Vienna, Austria.

Kenneth C. Kennedy II & Robert P. Kusy, UV-Cured Pultrusion Processing of Glass-Reinforced Polymer Composites, Journal of Vinyl and Additive Technology, vol. 1, Issue 3, pp. 182-186 (Sep. 1995), cited by applicant.

M. Martin-Gallego et al., Epoxy-Graphene UV-Cured Nanocomposites, Polymer, vol. 52, Issue 21, pp. 4664-4669 (Sep. 2011).

P. Compston, J, Schiemer, & A. Cvetanovska, Mechanical Properties and Styrene Emission Levels of a UV-Cured Glass-Fibre/Vinylester Composite, Composite Structures, vol. 86, pp. 22-26 (Mar. 2008).

S Kumar & J.-P. Kruth, Composites by Rapid Prototyping Technology, Materials and Design, (Feb. 2009).

S. L. Fan, F. Y. C. Boey, & M. J. M. Abadie, UV Curing of a Liquid Based Bismaleimide-Containing Polymer System, eXPRESS Polymer Letters, vol. 1, No. 6, pp. 397-405 (2007).

T. M. Llewelly-Jones, Bruce W. Drinkwater, and Richard S. Trask; 3D Printed Components With Ultrasonically Arranged Microscale Structure, Smart Materials and Structures, 2016, pp. 1-6, vol. 25, IOP Publishing Ltd., UK.

Vincent J. Lopata et al., Electron-Beam-Curable Epoxy Resins for the Manufacture of High-Performance Composites, Radiation Physics and Chemistry, vol. 56, pp, 405-415 (1999).

Yugang Duan et al., Effects of Compaction and UV Exposure on Performance of Acrylate/Glass-Fiber Composites Cured Layer by Layer, Journal of Applied Polymer Science, vol. 123, Issue 6, pp. 3799-805 (May 15, 2012).

\* cited by examiner

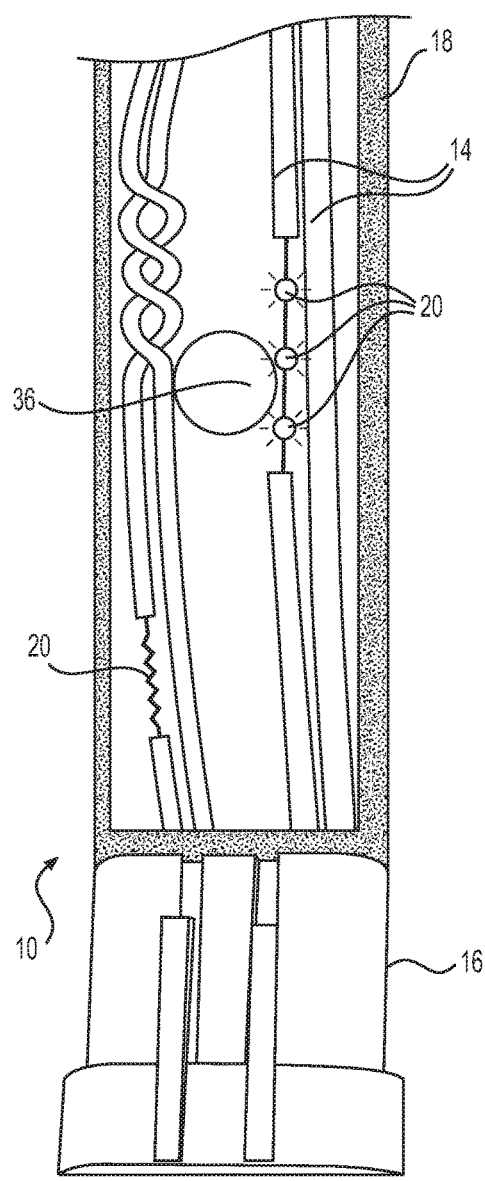
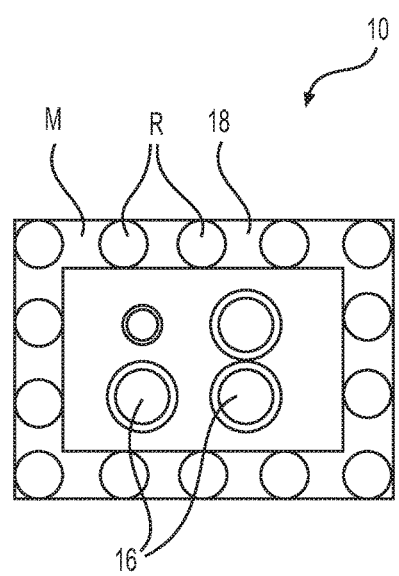
FIG. 3
FIG. 4

US 10,319,499 B1

SYSTEM AND METHOD FOR ADDITIVELY MANUFACTURING COMPOSITE WIRING HARNESS

TECHNICAL FIELD

The present disclosure relates generally to a wiring harness and, more particularly, to a system and method for additively manufacturing a wiring harness from a composite material.

BACKGROUND

A typical wiring harness is a collection of wires and cables that can be used to transmit power and/or signals throughout a machine. Wiring harnesses are commonly used in the transportation industry, for example inside vehicles (e.g., inside aircraft, automobiles, watercraft, and spacecraft). A wiring harness secures the individual wires and cables in a bundle, which is protected from environmental factors, such as abrasion, moisture, contamination, and vibrations. The bundled wires have a reduced footprint inside of the vehicle, and a time required for assembly of the wiring harness with the rest of the associated vehicle components may be lower than a time associated with assembling each individual wire or cable separately.

A wiring harness is generally fabricated as a subassembly via a manual process that is separate from assembly of the rest of the vehicle. For example, the individual wires and/or cables are manually cut to length, stripped at their ends of associated insolating sheathing, joined to associated connectors, and laid within a jig corresponding to one specific vehicle model. After all of the required wires and cables are in the jig, a sleeve (e.g., tape, shrink wrap, conduit, etc.) is placed around the wires. The subassembly is then complete and can thereafter be affixed to the vehicle (e.g., via zip ties, push-lock buttons, and/or threaded fasteners).

Although conventional wiring harnesses may be adequate for some applications, they can also be problematic. For example, conventional wiring harnesses can be heavy, expensive, prone to environmental contamination and/or damage, and difficult to conform to vehicle contours. In addition, whenever a change in the wiring harness is required (e.g., to accommodate new or additional vehicle components), the associated jig and sleeve may similarly require expensive and/or time-consuming changes.

The disclosed system, method, and wiring harness are directed to overcoming one or more of the problems set forth above and/or other problems of the prior art.

SUMMARY

In one aspect, the present disclosure is directed to a composite wiring harness. The composite wiring harness may include a plurality of elongated conductors arranged generally parallel to each other. The composite wiring harness may also include at least one connector connected to at least one end of at least one of the plurality of elongated conductors, and a sheath at least partially surrounding the plurality of elongated conductors. The sheath includes at least one reinforcement coated in a matrix material that is cured.

In another aspect, the present disclosure is directed to a method for additively manufacturing a composite wiring harness. The method may include directing a plurality of conductors through a print head, directing at least one reinforcement through the print head, and coating at least one of the plurality of conductors and the at least one reinforcement with a matrix material. The method may also include discharging the at least one of the plurality of conductors and the at least one reinforcement with the matrix material from the print head, and exposing the matrix material during discharging to a cure energy to cause hardening of a sheath around the plurality of conductors.

BRIEF DESCRIPTION OF THE DRAWINGS

FIGS. 3 and 4 are cross-sectional illustrations of the wiring harness of FIGS. 1 and 2.

DETAILED DESCRIPTION

Figure 1:
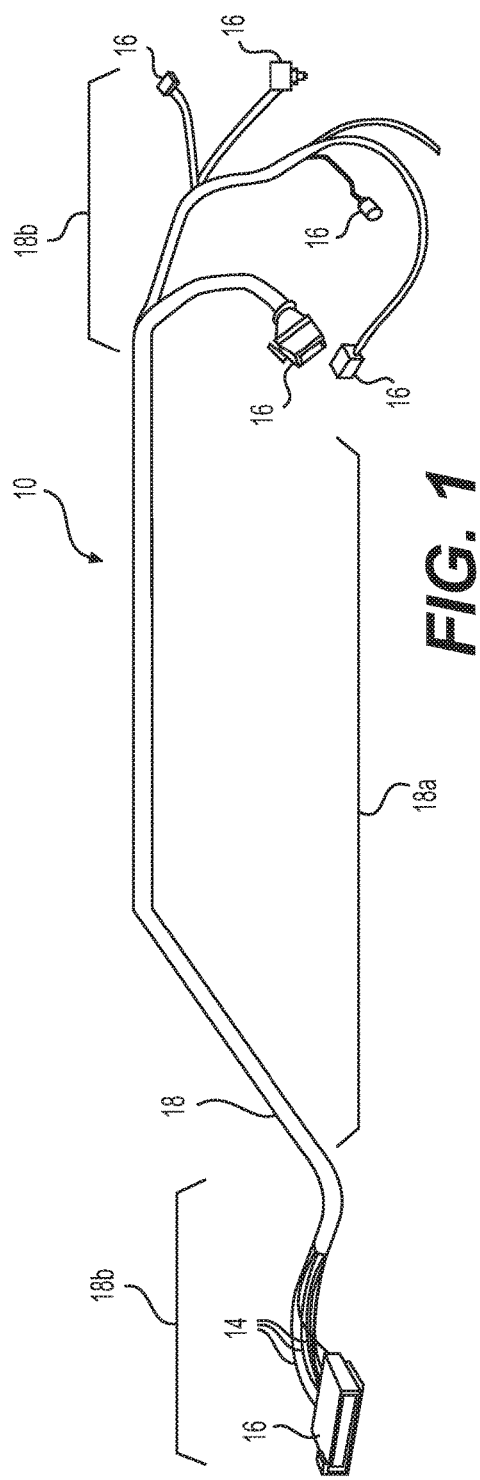
FIGS. 1 and 2 are diagrammatic illustrations of an exemplary wiring harness.
Figure 2:
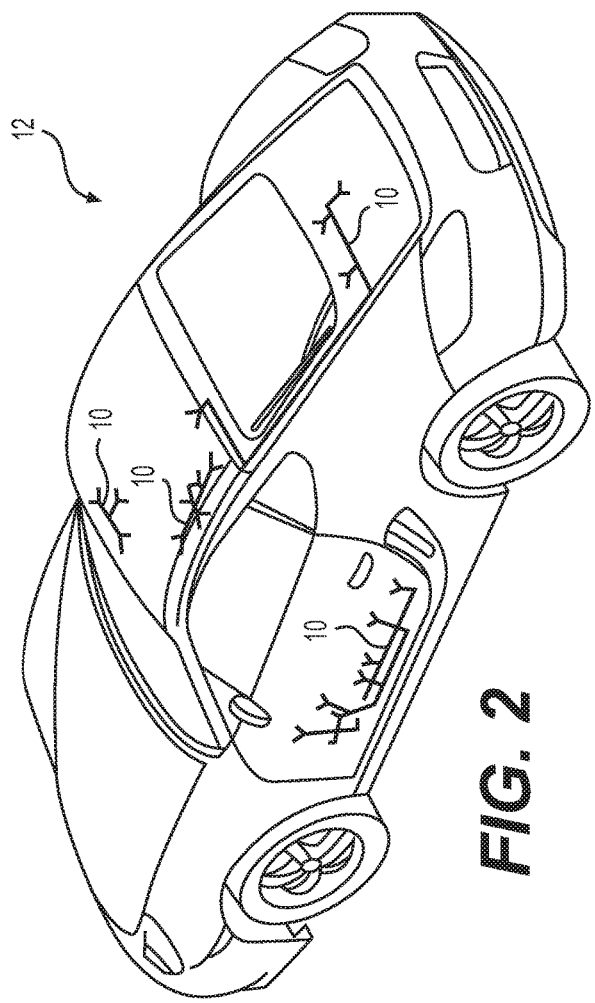

FIGS. 1 and 2 illustrate an exemplary wiring harness ("harness") 10. In the disclosed embodiment, harness 10 is intended for use with a machine 12. In the disclosed embodiments, machine 12 is a vehicle (e.g., an automobile—shown in FIG. 2). It is contemplated, however, that harness 10 could be used with any other type of mobile and/or stationary machine 12. Harness 10 may be configured to transmit power (e.g., electrical power, light, pressurized fluid, etc.) and/or signals between various components (e.g., between sensors, controllers, actuators, supplies, sources, instruments, indicators, etc.) of machine 12. Harness 10, regardless of its configuration and intended use, may include a plurality of conductors 14, at least one connector 16 affixed to an end of at least one of conductors 14, and a sheath 18 that at least partially surrounds conductors 14.

As shown in FIGS. 3 and 4, conductors 14 may be elongated structures that are configured to conduct any type of power and/or signal. For example, conductors 14 may include electrical leads (wires and/or metallic braids), fluid conduits, and/or optical tubes. Conductors 14 may be prefabricated (i.e., fabricated before manufacture and assembly of harness 10), and have a core (e.g., a solid or foam core) or a hollow tubular construction. In some embodiments, conductors 14 include both a core (e.g., a metallic core) and an outer tube (e.g., an insulative and/or shielding outer annular layer or skin). Conductors 14 may alternatively be fabricated in-situ with the rest of harness 10. Conductors 14 may be different types, have different diameters, be made from different materials, and/or have different lengths. Conductors 14 may be generally parallel to each other and gathered together into a single bundle without branching (see FIG. 5), a single bundle with multiple branches (see FIG. 1), and/or multiple sub-bundles (not shown). Any number of different configurations may be possible.

Any number and type of connector 16 may be joined to any number and type of conductors 14 within harness 10. Exemplary connectors 16 include blade connectors, ring and spade connectors, plug connectors, jack connectors, bus connectors, power connectors, RF connectors, twist connectors, component connectors, socket connectors, and other connectors known in the art. Connectors 16 may be affixed to a single or both ends of conductors 14 via mechanical means (e.g., crimping, twisting, braiding, bolting, etc.), chemical means (e.g., liquid adhesive, tape, etc.), thermo-mechanical means (e.g., heat shrinking, welding, soldering, brazing, etc.) and/or other means known in the art.

Conductors 14 may have variable properties along their length. For example, a cross-sectional size and/or shape may be different at different axial locations along a particular conductor 14. Additionally or alternatively, a conductivity and resistance may vary; a material consist may vary; and other properties known in the art may vary. For instance, a particular conductor 14 may include a first electrical lead having a larger diameter and being made from aluminum at a first location, and a second electrical lead having a smaller diameter and being made from copper at a second location. In this instance, the first electrical lead may be joined end-to-end with the first electrical lead (e.g., via soldering or friction welding) to make conductor 14, prior to subassembly of conductor 14 into harness 10. Conductors 14 may remain generally parallel along the length of harness 10, or be twisted together (e.g., in circuit pairs—see FIG. 3), so as to reduce electrical interference between unconnected conductors 14 and/or other components of machine 12.

In some applications, one or more functional elements 20 may be connected to or otherwise form a portion of conductor 14. Functional elements 20 may include, for example, resisters, capacitors, light-emitting diodes (LED), RFID tags, switches, batteries, fuses, filters (e.g., low-pass filters), etc. For example, a particular conductor 14 may have, at a particular axial distance along its length, an LED that is integrally joined between opposing first and second electrical leads. At this location, the LED may function as a continuity indicator, for example, illuminating any time a current of a minimum magnitude passes from the first electrical lead to the second electrical lead. Functional elements 20 may become an integral portion of conductors 14 prior to conductors 14 being sub-assembled into harness 10.

Sheath 18 may be configured as a cover, which substantially surrounds (e.g., on at least two sides, and most commonly on at least three sides) one or more bundles of conductors 14 within harness 10. In the embodiment shown in the cross-section of FIG. 4, harness 10 includes a four-sided sheath 18 that forms a complete enclosure around conductors 14. Although shown as having generally flat sides, it should be noted that sheath 18 could alternatively have any number of curved outer surfaces. It is contemplated that sheath 18 may be located immediately adjacent (e.g., tightly) against conductors 14 or spaced apart from conductors 14 (e.g., loosely). When sheath 18 is spaced apart from conductors 14, a space may exist between and/or around conductors 14. In some embodiments, a filler (e.g., a dielectric and/or thermally insulating material such as foam or paper) may be placed between and/or around conductors 14. Sheath 18 may be breathable or impermeable, thermally and/or electrically insulative, flame resistant, electrically conductive, magnetic, and/or have any other desired characteristic, depending on the application. Sheath 18 may be generally consistent in shape, size, wall thickness, and/or consist along its length, or variable and customizable, as desired.

For example, sheath 18 may be configured to reduce an electromagnetic field in and/or around conductors 14 that could negatively affect performance of other electrical components in machine 12. And the makeup of sheath 18 that provides for this reduction could be selectively varied during manufacturing, such that some areas of a particular harness 10 have specific shielding that is greater, lower, or simply different than shielding provided at other areas of harness 10. For example, a type of material, an amount of material, a location of material, a density of material, etc. that is used to makeup sheath 18 may be selective varied along the length and annular periphery of harness 10, as required to provide for the desired functionality of harness 10 (e.g., to provide a customer-specified electromagnetic capability).

In another example, sheath 18 may be configured to reduce a vibration in and/or around conductors 14 that could negatively affect performance and/or longevity of harness 10. And the makeup of sheath 18 that provides for this reduction could be selectively varied during manufacturing, such that some areas of a particular harness 10 have specific dampening characteristics that are greater, lower, or simply different than dampening provided at other areas of harness 10. For example, a type of material, an amount of material, a location of material, a density of material, etc. that is used to makeup sheath 18 may be selective varied along the length and annular periphery of harness 10, as required to provide for the desired functionality of harness 10 (e.g., to provide a customer-specified vibration-dampening capability).

Sheath 18 may be fabricated from at least a matrix material M. The matrix material M may include any type of material that is curable. For example, the matrix material M may be a liquid resin or a powdered metal. Exemplary resins include thermosets, single- or multi-part epoxy resins, polyester resins, cationic epoxies, acrylated epoxies, urethanes, esters, thermoplastics, photopolymers, polyepoxides, thiols, alkenes, thiol-enes, and more. After curing (e.g., hardening and/or sintering), the matrix material M may be opaque or transparent, depending on the intended application. In addition, it is contemplated that the matrix material M may vary along a length of sheath 18, such that some portions have different characteristics than other portions. For example, some portions may be opaque due to use of a specific matrix, while other portions are transparent due to use of a different matrix. Transparent sections of sheath 18 may allow for visual observation of conductors 14 and/or functional elements 20 inside of sheath 18. In another example, some portions may have vibration-dampened sections due to the use of a specific matrix (e.g., a thermoplastic), while other portions may have less dampening due to the use of a different matrix (e.g., a thermoset).

In the disclosed embodiments, sheath 18 is also fabricated from a reinforcement R that is at least partially coated in the matrix material M. The reinforcement R may include, for example, chopped and/or continuous fibers. When multiple reinforcements R are used together, the reinforcements R may be of the same type and have the same diameter and cross-sectional shape (e.g., circular, square, flat, etc.), or be of a different type with different diameters and/or cross-sectional shapes. The fibers may include, for example, carbon fibers, vegetable fibers, wood fibers, mineral fibers, glass fibers, metallic wires, optical tubes, etc. It should be noted that the term "reinforcement" is meant to encompass both structural and non-structural types of continuous materials that can be at least partially encased in the matrix material M. For instance, to provide the electromagnetic field shielding discussed above, the reinforcements R within sheath 18 could include braided wiring, solid or perforated foil, suspended metallic particles, and/or an electrically conductive matrix M that is selectively grounded at particular locations. It should also be noted that the transparency of sheath 18 mentioned above may be affected by both a transparency of the matrix material M and a transparency of the reinforcements R embedded in the matrix material. Accordingly, a transparent matrix coating applied to carbon fibers may result in a generally opaque material, whereas a transparent matrix coating applied to glass fibers may remain generally transparent.

Sheath 18 may be rigid or flexible at different locations along its length, depending on mounting requirements within machine 12. For example, a central portion 18a of sheath 18 that is configured to mount directly to a frame member or body panel of machine 12 may be generally rigid, while one or more ends 18b may be generally flexible. This may allow for secure connection of central portion 18a to machine 12, yet easy manipulation of ends 18b during joining of connectors 16 to other components. The rigidity/flexibility of sheath 18 may be adjusted through the use of different types, amounts, and/or orientations of matrix materials M and/or reinforcements R. When sheath 18 is mounted directly to the frame member or body panel of machine 12, one or more walls of sheath 18 maybe omitted, if desired, and the functionality thereof provided by way of the frame member or body panel.

Figure 5:
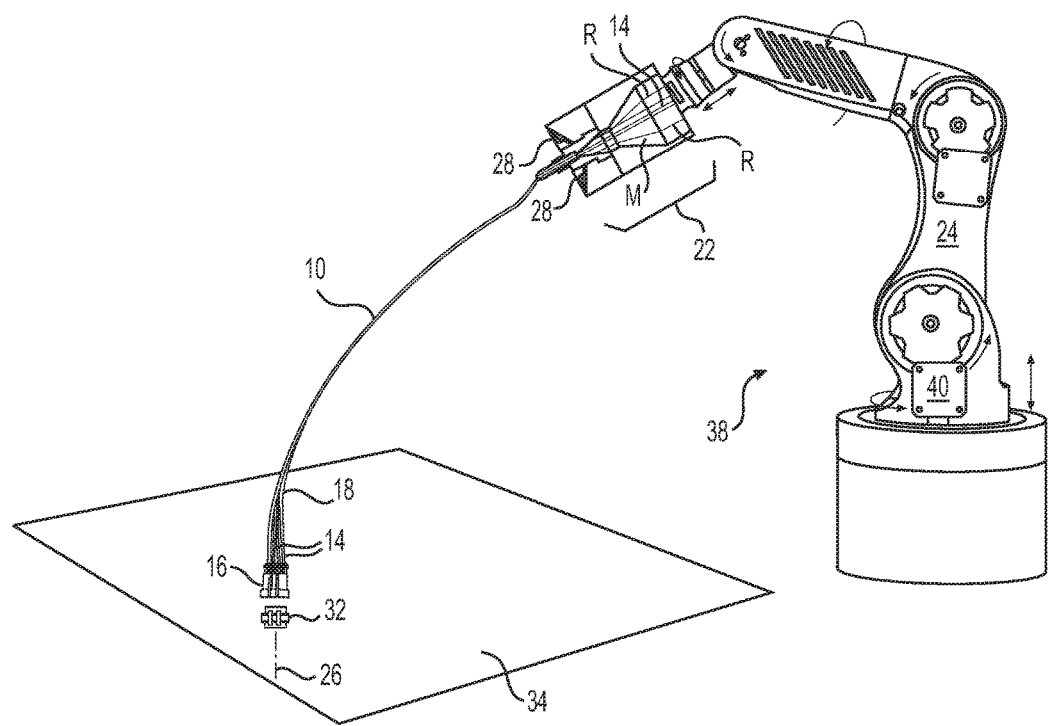
FIG. 5 is a diagrammatic illustration of an exemplary disclosed additively manufacturing system that may be used to fabricate the wiring harness of FIGS. 1-4.

As shown in FIG. 5, harness 10 may be fabricated via an additive manufacturing process. The additive manufacturing process may be a pultrusion and/or extrusion process, which creates sheath 18 around conductors 14 and functional elements 20. In particular, one or more print heads 22 may be coupled to a support 24 (e.g., to a robotic arm, a gantry, or a hybrid arm/gantry arrangement) that is capable of moving head(s) 22 in multiple directions during discharge of harness 10, such that a resulting longitudinal axis 26 of harness 10 is three-dimensional. Such a head 22 is disclosed, for example, in U.S. patent application Ser. No. 15/268,156, which is incorporated herein in its entirety by reference.

Head 22 may be configured to receive or otherwise contain the matrix material M, the reinforcement R, conductors 14, and/or functional elements 20 described above. In one embodiment, the matrix material M may be pressurized inside of head 22 by an external device (e.g., an extruder or another type of pump—not shown) that is fluidly connected to head 22 via a corresponding conduit (not shown). In another embodiment, the pressure may be generated completely inside of head 22 by a similar type of device and/or simply be the result of gravity acting on the matrix material M. In some instances, the matrix material M inside head 22 may need to be kept cool and/or dark in order to inhibit premature curing; while in other instances, the matrix material M may need to be kept warm for the same reason. In either situation, head 22 may be specially configured (e.g., insulated, chilled, and/or warmed) to provide for these needs.

The matrix material M stored inside head 22 may be used to coat any number of continuous conductors 14 and/or reinforcements R, wherein the coated reinforcements R (if present) make up walls of sheath 18 at least partially surrounding conductors 14. The reinforcements R may include single strands, a tow or roving of several strands, or a weave of many strands. The reinforcements R and/or conductors 14 may be coated with the matrix material M while inside head 22, while being passed to head 22, and/or while discharging from head 22, as desired. In some embodiments, a filler material (e.g., chopped fibers) may be mixed with the matrix material M before and/or after the matrix material M coats the reinforcements R. The matrix material M, the dry reinforcements R, reinforcements R already coated with the matrix material M, conductors 14, and the filler may be transported into head 22 in any manner apparent to one skilled in the art. The matrix-coated reinforcements R and/or conductors 14 may then pass through one or more circular orifices, rectangular orifices, triangular orifices, or orifices of another curved or polygonal shape located at a discharge end of head 22, where the conductors 14 are pressed together and surrounded by the reinforcements R (if present). The matrix material M may then be caused to cure by way of one or more cure enhancers (e.g., UV lights and/or ultrasonic emitters) 28.

In one example, all of harness 10 is fabricated in a single pass of print head 22. For example, conductors 14 (e.g., dry conductors 14 or matrix-coated conductors 14) may be discharged from a general center of one or more orifices of head 22, at the same time that matrix-coated reinforcements R (or only matrix material M) are discharging from a periphery of conductors 14. Alternatively, one or more walls or wall sections of sheath 18 may be discharged from the orifice(s) of print head 22 during a first pass (i.e., without any discharge of conductors 14), followed by discharging of conductors 14 inside of the already-discharged and cured walls during a subsequent pass. Thereafter, one or more additional walls or wall sections of sheath 18 may be discharged from print head 22 over conductors 14 and cured, to thereby close off sheath 18 around conductors 14. For example, a section of sheath 18 may be fabricated using a first matrix (e.g., a thermoset and carbon fibers), followed by filling in of that section with conductors 14 and/or a vibration dampening matrix (e.g., a thermoplastic), followed by additional sheath fabrication. It is contemplated that conductors 14 may be discharged from print head 22 prior to or without any separate fabrication of sheath 18, if desired. During this discharge, conductors 14 may be coated with the matrix material M and at least partially cured, if desired, to hold conductors 14 in a particular location and/or orientation in preparation for subsequent sheathing (if used). Sheath 18 and/or conductors 14 may be printed into free space, onto a build platform 30, and/or directly onto panels and/or frame members of machine 12, as desired. As described above, when printing directly onto panels and/or frame members of machine 12, sections of sheathing 18 may be omitted, allowing for the panels and/or frame members to perform the protective/structural functions of the omitted sections.

As described above, the additive manufacturing processes illustrated in FIG. 5 can be an extrusion process or a pultrusion processes. For example, extrusion may occur when the matrix material M, the associated reinforcements R, and/or conductors 14 are pushed from print head 22 during the movement of support 24. Pultrusion may occur after a length of matrix-coated reinforcement is connected to an anchor 32 and cured, followed by movement of print head 22 away from anchor 32. The movement of print head 22 away from anchor 32 may cause the reinforcements R and/or conductors 14 to be pulled from print head 22, along with the coating of matrix material M.

In one embodiment, anchor 32 may be a connector (e.g., a male connector) configured to couple with the corresponding connector 16 (e.g., a female connector) located at the end of one or more conductors 14. For example, the connector-type anchor 32 may be a permanent fixture that is rigidly joined to a print bed 34 and repetitively used during fabrication of similar harnesses. Specifically, after terminal ends of conductors 14 are first discharged through the orifice of print head 22, one or more of the terminal ends may be joined to connector 16 in any manner known in the art. Connector 16 may then be coupled with anchor 32 (i.e., without the use of the matrix material M or curing), such that subsequent movement of print head 22 away from anchor 32 results in the pulling of conductors 14 (and any associated reinforcements R of sheath 18) from print head 22. This may alleviate the need to sever harness 10 from anchor 32 after fabrication and/or reduce cleanup needs, in some situations. It is contemplated that multiple connector-type anchors 32 of varying sizes and types may be joined to print bed 34 and repetitively used during manufacture of harness 10, if desired.

In some embodiments, pultrusion may be selectively implemented to generate tension in conductors 14 and/or the reinforcements R that remains within harness 10 after fabrication. In particular, as conductors 14 and/or the reinforcements R are being pulled from print head 22, conductors 14 and/or the reinforcements R may be caused to straighten out and/or stretch. The stretching can create tension within conductors 14 and/or the reinforcements R. As long as the matrix M surrounding the conductors 14 and/or the reinforcements R cures and hardens while conductors 14 and/or the reinforcements R are stretched, at least some of this tension may remain in conductors 14 and/or the reinforcements R and function to increase a strength of the resulting composite harness 10.

Harnesses fabricated via the disclosed pultrusion process may have increased strength in an axial direction, due to the residual tension in conductors 14 and/or in the reinforcements R. It is also contemplated, however, that print head 22 could be rotated and/or rotationally oscillated (e.g. by support 24) during pultrusion, if desired, such that at least the reinforcements R have a spiraling and/or woven arrangement that facilitates increased tension-related strength in multiple different directions. The spiral- and/or weave-related parameters may be selectively varied to thereby vary characteristics (e.g., stiffness, strength, weight, etc.) of the resulting harness 10 at particular axial locations.

In addition, because the matrix material M surrounding each conductor 14 and/or reinforcement R may be cured and harden almost immediately upon discharge, the force pulling on conductors 14 and/or the reinforcements R may be continuously varied along the length of harness 10, such that different segments of the same conductors 14 and/or reinforcements R are stretched by differing amounts. Accordingly, the tensile stress induced within each of the different segments may also be different, resulting in the variable characteristics within the different segments of harness 10. This may be beneficial in variably loaded areas of harness 10.

In one exemplary embodiment, some of the reinforcements R within the composite material making up one or more portions of harness 10 have unique characteristics. For example, while a majority of harness 10 may comprise a structural type fiber (e.g., carbon fibers, glass fibers, or aramid fibers), some portions of harness 10 may include another type of fiber (e.g., electrically conductive fibers, optical fibers, shape memory fibers, magnetic fibers, etc.). The other type of fibers may be selectively interwoven with the structural type fibers at strategic locations. For example, electrically conductive fibers may be located at exposed areas of machine 12, and used as heating electrodes that can be connected to a power source and used to remove ice from machine 10 and/or to otherwise raise an operating temperature of harness 10 to within a desired zone. Alternative, electrically conductive fibers and/or optical fibers may be located at high-stress regions (e.g., at the intersection of doors and frames, powertrain components, etc.) and used as strain gauges to detect loading of machine 12 and/or harness 10. In yet another embodiment, fibers fabricated from a shape memory alloy (e.g., Nitonol) may be interwoven with the structural type fibers and selectively energized (e.g., via electricity or heat) to cause flexing (e.g., controlled pulling and/or pushing) of harness 10 that results in a desired performance.

Harnesses fabricated via conventional methods may be limited in their orientation, length, and/or number of associated branches. That is, the associated conductors may be generally fixed in the orientation of the associated jig that was used to make the corresponding harness. However, in the disclosed embodiments, because the matrix M surrounding each conductor 14 and/or reinforcements R may be cured and harden immediately upon discharge, conductors 14 and/or the reinforcements R may be caused to extend into free space following any trajectory and to any length, all without additional support. That is, conductors 14 and/or the reinforcements R may not be required to fit within a specific jig and have a specific length. This may allow for on-the-fly creation of unique harnesses 10.

In the disclosed embodiments, the matrix M within the composite material making up one or more portions of harness 10 has unique characteristics. For example, while a majority of harness 10 may comprise a structural type of matrix material (e.g., a conventional UV curable liquid resin, such as an acrylated epoxy), some portions of harness 10 may include another type of matrix material (e.g., a pyrolized matrix material, a matrix that remains somewhat flexible, etc.). The other type of matrix material M may be selectively used to coat conductors 14 and/or the reinforcements R at strategic locations. For example, the pyrolized matrix may be fed into print head 22 as print head 22 nears an exhaust pipe location of machine 12, such that the resulting sheath 18 may function as a heat shield in these areas. In another example, the flexible matrix may be fed into print head 22 as print head 22 nears a high-vibration area of machine 12, such that the resulting sheath 18 may be more able to accommodate movement without premature or excessive deterioration.

In some embodiments, one or more hardpoints 36 may be fabricated at predetermined sites within harness 10 to facilitate assembly and connection to machine 12. Each hardpoint 36 may be generally devoid of reinforcements R and/or conductors 14, and fabricated in anticipation of a subsequent subtractive (e.g., drilling, reaming, tapping, etc.) process. An exemplary hardpoint 36 is shown in FIG. 3, as a mounting location for threaded fastening of harness 10 to machine 12. As shown in this figure, hardpoint 36 has been drilled to receive a corresponding fastener (not shown). By creating hardpoint 36 generally devoid of reinforcements R and/or conductors 14, the likelihood of the subsequent subtractive process damaging reinforcements R and/or conductors 14 may be low. In addition, the subtractive process may be simpler to complete (e.g., easier, quicker, and/or less equipment-damaging) without reinforcements R and/or conductors 14 present.

Hardpoints 36 may be fabricated in different ways. For example, print head 22 may be controlled to diverge reinforcements R and/or conductors 14 away from (e.g., flow around) hardpoint 36, such that hardpoint 36 is filled with only matrix material M. It is contemplated that the matrix material M filling hardpoint 36 may be specifically placed within hardpoint 36 (e.g., at a time when no reinforcements R and/or conductors 14 are being discharged). Cure enhancers 28 (referring to FIG. 5) also may be selectively deactivated, blocked, or otherwise adjusted during fabrication of hardpoints 36, such that the matrix material M that makes up hardpoints 36 is not fully cured. This may allow for easier machining of hardpoints 36.

Hardpoints 36 may be manufactured to have a perimeter formed from reinforcements R in a particular configuration. That is, instead of simply avoiding reinforcement discharge at the intended locations of hardpoints 36, print head 22 may instead be caused to follow a predetermined trajectory around hardpoints 36 while discharging extra reinforcements R, such that one or more walls of reinforcements R are created at the perimeter. This may allow for increased strength, increased rigidity, and/or improved geometrical tolerances at hardpoints 36. Hardpoints 36 may have the same general thickness of surrounding regions or protrude from one or both opposing sides of harness 10, as desired.

In some embodiments, hardpoint 36 may be fabricated from a material that is different than a surrounding material of sheath 18. For example, hardpoint 36 may be fabricated from a different matrix material (e.g., a softer, harder, and/or more-easily machined matrix), from a different material type of reinforcement R, and/or from a different form of reinforcement R (e.g., chopped fiber or another filler). These differences may allow hardpoint 36 to have properties tailored for particular applications.

In one embodiment, hardpoint 36 may be used to selectively tack particular portions of harness 10 (e.g., junctions, bends, corners, connections, branches, etc.), without the use of any associated fastener. For example, the matrix material deposited at hardpoint 36 may be used alone to chemically bond harness 10 to the body panel or frame member of machine 12. The matrix material may be cured via enhancers 28 and/or another cure device that is specially formulated to work with the particular matrix material deposited within hardpoint 38. For instance, the matrix material previously deposited within hardpoint 38 could be temporarily softened and/or liquified during assembly of harness 10 to machine 12, if desired.

For the purposes of this disclosure, print head 22, support 24, and print bed 34 may be considered an additive manufacturing system ("system") 38. In some embodiments, a controller 40 may additionally be provided as a portion of system 38, and communicatively coupled with print head 22, support 24, and/or print bed 34. Controller 40 may embody a single processor or multiple processors that include a means for controlling an operation of system 38. Controller 40 may include one or more general- or special-purpose processors or microprocessors. Controller 40 may further include or be associated with a memory for storing data such as, for example, design limits, performance characteristics, operational instructions, matrix characteristics, reinforcement characteristics, conductor characteristics, characteristics of harness 10 and/or machine 12, and corresponding parameters of each component of system 38. Various other known circuits may be associated with controller 40, including power supply circuitry, signal-conditioning circuitry, solenoid/motor driver circuitry, communication circuitry, and other appropriate circuitry. Moreover, controller 40 may be capable of communicating with other components of system 38 via wired and/or wireless transmission.

One or more maps may be stored in the memory of controller 40 and used during fabrication of harness 10. Each of these maps may include a collection of data in the form of lookup tables, graphs, and/or equations. In the disclosed embodiment, the maps are used by controller 40 to determine desired characteristics of cure enhancers 28, the associated matrix material M, the associated reinforcements R, and/or conductors 14 and/or at different locations within harness 10 relative to contours of machine 12. The characteristics may include, among others, a type, quantity, and/or configuration of reinforcement R, conductors 14, and/or the matrix material M to be discharged at a particular location within harness 10 and/or on machine 12, and/or an amount, shape, and/or location of desired curing. Controller 40 may then correlate operation of support 24 (e.g., the location and/or orientation of print head 22) and/or the discharge of material from print head 22 (a type of material, desired performance of the material, cross-linking requirements of the material, a discharge rate, etc.) with the operation of cure enhancers 28, such that harness 10 is produced in a desired manner.

INDUSTRIAL APPLICABILITY

The disclosed arrangements and designs of harness 10 may be used to conduct power and/or signals within any type of machine 12. For example, harness 10 may be used in connection with an automobile, an airplane, a drone, a boat, or any other type of machine, where light-weight, low-cost, small-footprint, and high-performance are important. Harness 10 may be light-weight due to the use of composite materials. Harness 10 may be low-cost due to the reduction in dedicated tooling for each harness configuration, and due to the ability to redesign and make on-the-fly adjustments to the configuration of harness 10. Harness 10 may have a low footprint due to the ability to print harness 10 in place on machine 12. In addition, harness 10 may be high-performance due to the unique ways that particular reinforcements R, conductors 14, functional elements 20, and matrix materials M can be used and laid out within harness 10. Operation of system 38 will now be described in detail, with reference to FIG. 5.

At a start of a manufacturing event, information regarding a desired harness 10 and/or associated machine 12 may be loaded into system 38 (e.g., into controller 40 that is responsible for regulating operation of support 24, cure enhancer(s) 28, and/or any other associated components). This information may include, among other things, a size (e.g., diameter, wall thickness, length, etc.), a contour (e.g., a trajectory), surface features (e.g., ridge size, location, thickness, length; flange size, location, thickness, length; etc.), connector geometry (e.g., locations and sizes of couplings, tees, splices, etc.), location-specific matrix stipulations, location-specific reinforcement stipulations, location-specific conductor stipulations, desired cure rates, cure locations, cure shapes, cure amounts, hardpoint locations, machine contours, etc. It should be noted that this information may alternatively or additionally be loaded into system 38 at different times and/or continuously during the manufacturing event, if desired.

Based on the component information, and one or more different (e.g., different sizes, shapes, and/or types of) reinforcements R, conductors 14, and/or matrix materials M may be selectively installed within system 38 and/or continuously supplied into print head 22. The corresponding reinforcements R (e.g., prepreg or dry fibers, tows, ribbons, or sheets) may be passed through one or more fiber-teasing mechanisms (e.g., between the bristles of adjacent brushes, and/or over or around protrusions, etc.—not shown) and the orifice(s) of print head 22, and thereafter connected (along with conductors 14) to a pulling machine (not shown) and/or to a mounting fixture (e.g., to anchor 32 and/or print bed 34). Installation of the matrix material M may include filling print head 22 with resin and/or coupling of an extruder (not shown) to print head 22.

Print head 22 may be moved by support 24 under the regulation of controller 40 to cause matrix-coated reinforcements R and/or conductors 14 to be placed against or on a corresponding anchor 32. Cure enhancers 28 may then be selectively activated to cause hardening of the matrix material M surrounding the reinforcements R and/or conductors 14, thereby bonding the reinforcements to anchor 32. In some embodiments, activation of cure enhancers 28 may be unnecessary, and connector 16 may simply need to be joined to one or more ends of conductors 14 in a conventional manner, and then plugged into the corresponding geometry of anchor 32.

The component information may then be used to control operation of system 38. For example, the reinforcements R and/or conductors 14 may be pulled through the fiber-teasing mechanism; separated and/or flattened; submerged within the matrix material M, wrung out by any associated regulating device (not shown); and then discharged through the orifice(s) of print head 22. Controller 40 may selectively cause support 24 to move print head 22 in a desired manner at this time, such that axis 26 of the resulting harness 10 follows a desired trajectory (e.g., a free-space, unsupported, 3-D trajectory). In addition, cure enhancers 28 may be selectively activated by controller 40 during material discharge to initiate, speed up, or complete hardening of the matrix material M. Once harness 10 has grown to a desired length, the reinforcements R and/or conductors 14 may be disconnected (e.g., severed) from print head 22 in any desired manner. In some embodiments, the severed ends of conductors 14 may then be joined to additional connectors 16, if desired, thereby completing fabrication of harness 10.

It will be apparent to those skilled in the art that various modifications and variations can be made to the disclosed harness, system, and method. Other embodiments will be apparent to those skilled in the art from consideration of the specification and practice of the disclosed harness, system, and method. It is intended that the specification and examples be considered as exemplary only, with a true scope being indicated by the following claims and their equivalents.

What is claimed is:

1. A composite wiring harness, comprising:
    a plurality of elongated conductors arranged generally parallel to each other;
    at least one connector connected to at least one end of at least one of the plurality of elongated conductors; and
    a sheath at least partially surrounding the plurality of elongated conductors and forming an outer shell of the composite wiring harness,
    wherein the sheath includes:
        a rigid portion and a flexible portion; and
        at least one of a glass fiber, a carbon fiber, and an aramid that is continuous through the rigid and flexible portions and coated in a thermoset matrix material, the thermoset matrix material having a first performance characteristic in the rigid portion and a second performance characteristic in the flexible portion.

2. The composite wiring harness of claim 1, wherein a characteristic of at least one of the thermoset matrix material and the at least one of the glass fiber, the carbon fiber, and the aramid fiber is different between the rigid and flexible portions.

3. The composite wiring harness of claim 1, wherein the plurality of elongated conductors are visible through only a portion of the sheath.

4. The composite wiring harness of claim 1, wherein the at least one of the glass fiber, the carbon fiber, and the aramid fiber is generally parallel with the plurality of elongated conductors.

5. The composite wiring harness of claim 1, wherein the plurality of elongated conductors includes at least one of a solid and semi-solid core.

6. The composite wiring harness of claim 5, wherein the plurality of elongated conductors further includes an insulating outer annular layer.

7. The composite wiring harness of claim 1, wherein the plurality of elongated conductors includes a hollow tubular structure.

8. The composite wiring harness of claim 1, wherein the sheath provides electromagnetic field shielding.

9. The composite wiring harness of claim 8, wherein the electromagnetic field shielding is variable along a length of the composite wiring harness.

* * * * *